United States Patent [19]

Brechlin

[11] Patent Number: 4,548,885
[45] Date of Patent: Oct. 22, 1985

[54] PROCESS FOR USING A FLEXIBLE LAMINATABLE PHOTOSENSITIVE LAYER IN THE PRODUCTION OF A PRINTED CIRCUIT

[75] Inventor: Alfred Brechlin, Wiesbaden, Fed. Rep. of Germany

[73] Assignee: Hoechst Aktiengesellschaft, Frankfurt am Main, Fed. Rep. of Germany

[21] Appl. No.: 664,427

[22] Filed: Oct. 24, 1984

Related U.S. Application Data

[62] Division of Ser. No. 275,712, Jun. 22, 1981, Pat. No. 4,492,747.

[30] Foreign Application Priority Data

Jun. 30, 1980 [DE] Fed. Rep. of Germany ....... 3024772

[51] Int. Cl.$^4$ ................... G03G 5/06; G03G 13/26
[52] U.S. Cl. ......................................... 430/49; 430/50
[58] Field of Search ........................... 430/49, 50, 96

[56] References Cited

U.S. PATENT DOCUMENTS

| | | | |
|---|---|---|---|
| 3,189,447 | 6/1965 | Neugebauer et al. | 430/77 |
| 3,257,203 | 6/1966 | Sus et al. | 430/77 |
| 3,796,573 | 3/1974 | Jones | 430/96 |
| 3,804,631 | 4/1974 | Faust | 430/286 |
| 4,063,948 | 12/1977 | Lind | 430/83 |
| 4,125,701 | 11/1978 | Mukoh et al. | 430/96 |
| 4,149,798 | 4/1979 | McGowan et al. | 355/8 |

FOREIGN PATENT DOCUMENTS 2755851 6/1979 Fed. Rep. of Germany .
942810 11/1963 United Kingdom .
1413352 11/1975 United Kingdom .

OTHER PUBLICATIONS

Lind, *Chem. Abst.*, No. 91: 220343h, 1979, p. 608.

*Primary Examiner*—Richard L. Schilling
*Attorney, Agent, or Firm*—Schwartz, Jeffery, Schwaab, Mack, Blumenthal & Evans

[57] ABSTRACT

Disclosed is a flexible photosensitive layer containing a polymeric binder, which is capable of being laminated and is applied to a preferably flexible support. The photosensitive layer comprises a photoconductor layer composed of a substantially organic photoconductor, the binder, a sensitizer and/or activator, in which the binder comprises at least one copolymer having repeating units of the general formula

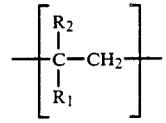

Wherein
R$_1$ denotes

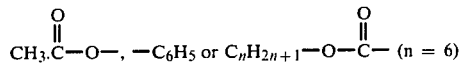

and R$_2$ denotes H or —CH$_3$.

3 Claims, No Drawings

PROCESS FOR USING A FLEXIBLE LAMINATABLE PHOTOSENSITIVE LAYER IN THE PRODUCTION OF A PRINTED CIRCUIT

This is a division of application Ser. No. 275,712, filed June 22, 1981, now U.S. Pat. No. 4,492,747.

BACKGROUND OF THE INVENTION

The present invention relates to an elastic photosensitive layer containing a polymeric binder, which is capable of being laminated and is applied to a preferably flexible support.

From German Auslegeschrift No. 20 64 080 (corresponding to U.S. Pat. No. 3,804,631) it is known to produce printed circuits by means of photosensitive mixtures in the form of compact layers which represent photopolymerizable copying compositions and which are applied to a metallic support or to an intermediate support consisting of plastic film. These layers are rendered insoluble in the areas exposed to light. The layer areas which were not struck by light can, after exposure, be dissolved away by aqueous-alkaline solutions. As the binders, there are employed copolymers of methacrylic acid and at least one alkyl methacrylate in which at least one of the alkyl methacrylates has an alkyl group comprising from 4 to 15 carbon atoms. The elasticity of such layers must be adjusted by the addition of a plasticizer. Furthermore, the production of printed circuits is tied to a process which, due to the photopolymerization, necessitates an undesirably high energy supply.

There are, however, also processes which require lower light energies for the production of printing masters and printed circuits. One of these is, for example, the electrophotographic process. Various electrophotographic layers have been described which are suitable for the production of such articles. They comprise, for example, a photoconductive, polynuclear, carboxylic aromatic as the photoconductor and are used together with an activator and binders, such as a terpolymer composed of 60% of methacrylic acid-n-hexylester, 10% of styrene and 30% of methacrylic acid (German Offenlegungsschrift No. 27 55 851). The layer is applied to the printing plate support in the form of a solution and the solvent is then removed by evaporation. If the support is flexible or elastic, however, layers of this kind are still not up to ultimate requirements with regard to flexibility or elasticity and, additionally, the adhesion offered by them is not good enough for application to an intermediate support, particularly, if the support film is bent or rolled up.

For the production of printing masters and printed circuits by electrophotographic means, it is also known to use a copolymer of styrene and maleic anhydride as the binder (German Offenlegungsschrift No. 27 26 116 and German Offenlegungsschrift No. 25 26 720, corresponding to U.S. Pat. No. 4,063,948). On a flexible support material and in the specified thickness of 5 μm, however, the binder gives merely a brittle layer, the adhesion of which is not too good and which can be transferred with difficulty only by the application of elevated temperatures and pressure. At these temperatures, polyester films used as supports begin to get distorted and this leads to an undesirable formation of streaks and thickness variations in the transferred layers. In addition, it is difficult to decoat transferred layers of this kind, using aqueous-alkaline solutions, in a subsequent process step.

It has become apparent that, although the known binders and/or layers are well-suited for the production of printing plates and printed circuits on rigid supports, they are less suitable where the supports are elastic or flexible and where relatively greater thicknesses of the layers are required.

SUMMARY OF THE INVENTION

It is therefore an object of the present invention to provide an improved elastic photosensitive layer.

It is another object of the invention to provide a flexible photosensitive layer which is capable of being laminated, for use in a reprographic process requiring less energy, such as the electrophotographic process.

A further object of the invention resides in providing such a photosensitive layer which lends itself to the manufacture of printed circuit boards, printed circuits or etched parts and has a high sensitivity to light and the necessary flexibility even at a relatively large layer thickness.

It is a further object of the invention to provide such a photosensitive layer which, when placed on a flexible support, for example, an optionally metallized or non-metallized or metal-coated polyester film, neither comes off nor forms cracks in the usual handling.

Still another object of the invention is to provide such a photosensitive layer wherein, in a thermal lamination process, it is possible to detach the layer easily and completely from the flexible support and transfer it to a support which has at least one metallic surface and to which it must adhere well.

A further object of the invention is to provide such a photosensitive layer which ensures that, after transfer of the layer to a second support, the initial support can be stripped off completely and without causing any damage.

It is another object of the present invention to provide an improved process for preparing a printed circuit board or an etched part.

In accomplishing the foregoing objects, there has been provided in accordance with one aspect of the present invention a flexible photosensitive layer, comprising a substantially organic photoconductor; a polymeric binder; and a sensitizer and/or an activator, wherein the binder comprises at least one copolymer having repeating units of the formula

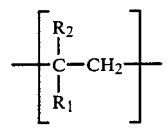

wherein
R₁ denotes

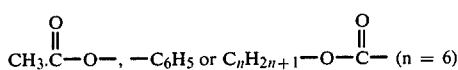

and R₂ denotes H or —CH₃. In one embodiment, the binder comprises a copolymer comprised of an alkyl methacrylate having 6 carbon atoms in the alkyl goup, styrene and methacrylic acid and/or acrylic acid. In another embodiment, the binder comprises a copolymer comprised of an alkyl methacrylate having 6 carbon atoms in the alkyl group, styrene, vinyl acetate and acrylic acid. Preferably, the photosensitive layer is carried on a flexible support layer.

In another aspect of the present invention, there has been provided a process for the production of a printed circuit board or an etched part, comprising the steps of applying a photosensitive layer as defined above to a support member; charging the photosensitive layer; exposing the photosensitive layer imagewise to an original to produce a latent charge image on the non-exposed areas of the layer; masking the latent charge image; decoating the non-image areas of the photosensitive layer; and chemically treating the decoated photosensitive layer to provide a conductive layer in one of the image or non-image areas. In one embodiment the chemical treating step comprises etching the decoated non-image areas to leave a conductive layer only in the non-decoated image areas, whereas in another embodiment the chemical treating step comprises electroplating the decoated non-image areas with metals which can serve as an etch resist mask in the subsequent etching process, after decoating the image areas in order to produce a conductive pattern in the non-image areas.

Further objects, features and advantages of the present invention will become apparent from the detailed description of preferred embodiments which follows.

DETAILED DESCRIPTION OF PREFERRED EMBODIMENTS

The invention provides a flexible photosensitive layer of the aforementioned kind, which is capable of being laminated and which has the feature that it represents a photoconductor layer composed of a substantially organic photoconductor, a binder and a sensitizer and/or activator, in which the binder comprises at least one copolymer having repeating units of the general formula

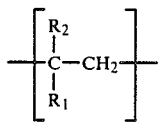

wherein
$R_1$ denotes $$CH_3.\overset{O}{\underset{\|}{C}}-O-,\ -C_6H_5\ \text{or}\ C_nH_{2n+1}-O-\overset{O}{\underset{\|}{C}}-\ (n = 6)$$

and $R_2$ denotes H or $-CH_3$.

In a preferred embodiment, the layer contains as the binder a copolymer of alkyl methacrylate having 6 carbon atoms in the alkyl group, styrene and methacrylic acid and/or acrylic acid. The binder preferably has an acid number ranging from about 90 to 250 and an intrinsic viscosity at 20° C. in an ethanol/toluene (1:1) ranging from about 0.100 to 0.300.

As a result, a flexible, insulating organic photoconductor layer is provided which lends itself particularly advantageously to the preparation of etch-resist layers or galvano-resist layers on supports consisting of metal or having metallic surfaces, preferably of copper. In the first place, the layer is excellently suited for transfer by thermal lamination onto supports, such as copper foils or foils made of other metals, for example, of magnesium, aluminum, zinc, nickel, chromium, brass or steel, which are conventionally used for the production of printed circuits or etched parts which are used in the electronics industry.

The photoconductor layer of the invention is particularly advantageously used and handled in the form of a so-called "dry-resist material", because it is readily transferable to metal supports and results in adhesive layers on these supports. In that case, a polyester film, preferably, polyethylene terephthalate film, is especially suitable as the flexible support.

The swellability or solubility of the layer according to the invention in the aqueous-alkaline decoating solutions used in practice is not adversely affected by the thermal lamination process.

By adjusting the type and quantitative proportions of its constituents, its acid number and its specific viscosity, the binder of the invention can be adapted over a wide range to all practical requirements with regard to flexibility, transferability and adhesion.

Especially, the acid number of the binder is adjusted in such a way that during the usual decoating time of about 60 to 120 seconds, the aqueous-alkaline decoating solution does not attack even the lateral edges of those parts of the photoconductor layer which are covered by toner after developing; otherwise, the decoating solution could penetrate under the edges of the characters and fine lines and would expose larger areas of the support layer consisting of metal than are intended to be removed in the subsequent etching process. For that purpose, it has proved advantageous to adjust the acid number to values ranging between about 90 and 250, preferably between about 100 and 230.

On the one hand, while it is necessary that the binders of the invention have a sufficient acid character to render them suitable for decoating by aqueous-alkaline solutions, on the other hand, brittleness of the layer is augmented by an increasing layer thickness and rising acid number.

It has been found that by adjusting the proportion between the acidifying and the plastifying monomers and also the molecular size of the polymers, binders are obtained which are suitable according to the invention.

Taking the value of the intrinsic viscosity ($\eta$) as a criterion for the average molecular size, a particularly suitable copolymer is one which has an intrinsic viscosity, measured at 20° C. in a mixture composed of 1 part by weight of toluene and 1 part by weight of ethanol, ranging between about 0.100 and 0.300, with

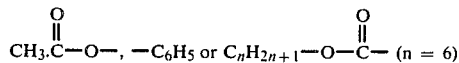

$\eta$ spec. denoting the specific viscosity and c the concentration of the dissolved polymer, measured in grams of polymer per 100 ml of solvent.

In contrast with photoconductor layers for electrophotographic printing masters, etc., the photoconductor layers according to the present invention, which are intended for printed circuits and etched parts, must meet further rigid standards, due to the great number of process steps required in the production.

The layers are relatively thick, i.e., layer thicknesses correspond to a coating of about 15 to 30 g/m². It was realized that by increasing the up to now normally used layer thickness of about 5 μm, the electrophotographic sensitivity was considerably reduced so that previously proposed insulating, organic photoconductor layers could not be employed without difficulty for printed circuit boards in the required layer thicknesses. The loss of sensitivity manifested itself in an insufficient charge difference between exposed and non-exposed areas on the surface of the photoconductor layer and in a high residual charge on the exposed parts of the layer. For reasons of practicability, it was impossible to increase the radiant power of the light source or to prolong the exposure time.

Surprisingly, the sensitivity of layers which are about 20 μm thick can be adjusted by considerably reducing the amount of sensitizing dyestuff, thus lowering the light absorption in the thicker layer. Photoconductor layers are therefore used, in which the proportion by weight between organic photoconductor and dissolved sensitizer is in the range from about 80:1 to 1000:1.

The requirement of thicker layers results from the manufacturing process for printed circuits when it is intended to use the metal resist process, in which the copying layer is to protect, during the ensuing electroplating with copper and tin-lead or nickel, the metal which has not been exposed in the developing step. In the procedure, the photoconductor layer of the invention, which is additionally covered by the toner layer, serves as a galvano-resist. Furthermore, the metal layers applied by electroplating should, if possible, not form any fungus-like projections. This is prevented by a corresponding adjustment of the thickness of the electrophotographic layer. The binders according to the present invention must additionally be resistant to the baths used in depositing copper, nickel, lead-tin or gold, which baths have pH values below 1 to 4.

If the substractive process is used, which is well-established in circuit-board making, the photoconductor layer remaining after developing with aqueous-alkaline solutions must protect the copper which it covers from the attack of the etching solutions, and it thus serves as an etch resist. In general, it cannot be precluded that the etchant, in the course of the etching procedure, attacks even below the edges of the layer, i.e., that undercutting takes place. This leads to a formation of projections, also called "resist projections", which are no longer sustained by the metal support. These projections are mechanically very sensitive and can easily break off, for example, during spray etching. As a result, additional parts of the support surface become accessible to the etchant. Also for this application it has proved disadvantageous to have a brittle binder which easily breaks off under the above-described conditions. As the etching reagent for copper supports, solutions of ferric chloride comprising a strong hydrochloric acid are used and also ammoniacal cupric ammonium chloride solutions having a pH value of up to 8.5. Suitable etchants for aluminum supports are solutions of cupric chloride comprising a weak hydrochloric acid. Consequently, the layers and the binders contained therein must also be resistant to the action of these solutions. Binders, which have high acid numbers, are therefore more easily attacked by alkaline etching baths than others which have an adapted lower acid number.

The flexible, insulating photoconductor layer of the invention is therefore applied to a flexible support in a thickness exceeding 15 μm. If the support serves as an intermediate support, the layer is subsequently transferred by application of heat and slight pressure to a support which has at least a metallic surface.

In a preferred embodiment, the flexible insulating photoconductor layer contains as the binder a copolymer of an alkyl methacrylate having 6 carbon atoms in the alkyl group, styrene and methacrylic acid and/or acrylic acid.

According to a further embodiment, the layer comprises as the binder a copolymer of an alkyl methacrylate having 6 carbon atoms in the alkyl group and a mixture of methacrylic acid and acrylic acid or a copolymer of vinyl acetate, an alkyl methacrylate having 6 carbon atoms in the alkyl group, styrene and acrylic acid.

In the copolymer according to the invention, the proportion by weight between styrene and alkyl methacrylate is preferably in the range between about 0:1 and 1:8. The proportion by weight between the methacrylic acid and/or acrylic acid component and the sum of the components of alkyl methacrylate and styrene ranges between about 1:1 and 1:5. It is particularly preferred to have quantitative proportions of the components which are as follows: from about 55 to 75 parts by weight (p.b.w.) of an alkyl methacrylate having 6 carbon atoms in the alkyl chain, from about 0 to 12 p.b.w. of styrene and from about 15 to 35 p.b.w. of methacrylic acid and/or acrylic acid. By varying the quantitative proportion of methacrylic acid to acrylic acid, it is possible to achieve a desired flexibility of the copolymer and to adjust the adhesion of the copolymer on copper or other metals during the laminating step. The proportion by weight between methacrylic acid and acrylic acid may adopt values between about 0:1 and 2:1.

In a further copolymer, the proportion by weight between styrene and alkyl methacrylate ranges between about 1:0.8 and 1:8 and the proportion by weight of styrene to vinyl acetate ranges between about 1:1 and 1:3. The proportion of the acrylic acid component to the sum of the components including alkyl methacrylate, styrene and vinyl acetate ranges between about 1:2 and 1:8.

It is particularly preferred to have quantitative proportions ranging from about 20 to 65 p.b.w. of an alkyl methacrylate having 6 carbon atoms in the alkyl chain, from about 15 to 35 p.b.w. of vinyl acetate, from about 10 to 25 p.b.w. of styrene and from about 10 to 25 p.b.w. of acrylic acid.

The insulating, organic photoconductor layers according to the invention have an adequate flexibility on a flexible support and can thus be rolled up or bent without chipping off or developing cracks.

At temperatures between 100° C. to 150° C., for example, roll temperatures, and by exerting slight pressure, it is possible to transfer the layers completely from the flexible support films to metal plates, such as copper plates, and they exhibit a good adhesion after cooling down. The initial support can be easily and completely peeled off from the photoconductor layer, without thereby damaging the layer.

After transfer, the photoconductor layers of the invention can be charged by a corona potential. They can be imagewise exposed using normal white light or monochromatic light, especially the light of a low-energy monochromatic laser light source, thus causing the charge in the exposed areas to leak from the layer into the support which is grounded or maintained at a particular potential.

The light-sensitivity of the photoconductor layers according to the invention is such that they are capable of being imagewise exposed by means of an argon-ion laser operating at an energy of about 40 to 80 μJ/cm². It has been found that even exposure in the range from about 20 to 50 μJ/cm² leads to good results.

Those areas of the insulating photoconductive layer which still carry a charge attract the triboelectrically oppositely charged toner particles of a liquid or pulverulent toner which is fused to the photoconductor layer after a short fixing time (2 minutes at 170° C.) and protects these image areas from the decoating solution.

In the case of laminated layers which are about 15 μm to 30 μm thick, the areas which are not covered by the toner are readily removable with the aid of aqueous-alkaline decoating solutions, while the toner-covered portions of these layers are not removed.

If the photoconductor layers of the invention are used for the production of printed circuits according to the substractive process, the layers exhibit an excellent resistance to the conventional etchants, over a range of pH<1 to 8.5. In the production of printed circuits according to the metal-resist process, the layers show a good resistance to the normally used copper, nickel, lead-tin and gold-plating baths.

The insulating photoconductive layer of the invention can be supplied to the user in the form of a presensitized copying material on a suitable metallic or metallized support, for example, on copper, aluminum, chromium, nickel or steel, for the production of printed circuits.

For the same application, it can, however, also be marketed as a so-called "dry-resist material". The insulating photoconductor layer is then on a metallized or non-metallized flexible intermediate support and is by the user transferred by lamination under the action of heat to the material which is to be electroplated or etched, for example, to a metal foil, such as an aluminum, chromium, nickel or steel foil, preferably to a copper foil. After cooling down and peeling off the intermediate support, the photoconductor layer is ready to be charged, exposed, treated with toner, fixed, decoated and optionally electroplated or etched. As the organic photoconductors, the known compounds with photoconductive properties can be used. Preferred are compounds such as 2,5-bis(4'-diethylaminophenyl)-1,3,4-oxadiazole (German Patent No. 10 58 836, corresponding to U.S. Pat. No. 3,189,447 and German Auslegeschrift No. 25 26 720, corresponding to U.S. Pat. No. 4,063,948) or 2-vinyl-4-(2'-chlorophenyl)-5-(4"-diethylaminophenyl)-1,3-oxazole or 2-phenyl-4-(2'-chlorophenyl)5-(4"-diethylaminophenyl)-1,3-oxazole (German Patent No. 11 20 875, corresponding to U.S. Pat. No. 3,257,203 and German Auslegeschrift No. 25 26 720, corresponding to U.S. Pat. No. 4,063,948) or a condensation product of 3-bromopyrene and formaldehyde (German Offenlegungsschrift No. 27 26 116). These prior publications are hereby incorporated by reference.

Activators for organic, insulating photoconductors are known and are, for example, disclosed in German Auslegeschrift No. 11 27 218 (corresponding to British patent specification No. 942,810). Particularly suitable are compounds such as 3,6-dinitronaphthalene-1,8-dicarboxylic acid anhydride or 9-dicyanomethylene-2,7-dinitrofluorene. The disclosure of these prior publications is hereby incorporated by reference.

The insulating organic photoconductor layers are prepared in the known manner. It is, for example, possible to dissolve the components in one or several solvents and apply the solution as a film to the support, by casting, spraying, dipping, flow coating or roller coating etc. The solvent is then driven out by heat.

The flexible, insulating photoconductive layers are, in known manner, charged to a negative potential of several hundred volts and exposed. Then the electrically charged image areas are dyed with a liquid or pulverulent, triboelectrically positively charged toner, fixed and decoated.

Suitable decoating agents are preferably aqueous-alkaline solutions, for example, of alkali-metal phosphates or alkali-metal silicates which, if required, may contain minor amounts of water-soluble organic solvents.

The photoconductor layer may be exposed through a transparent film original using normal white light or by projection by way of a repro camera. In the case of suitably sensitized layers, exposure may also be effected with monochromatic light, especially with laser light.

A suitable apparatus for laser light exposure is described in published European patent application No. 0 000 048 (June 5, 1978/Dec. 20, 1978) for the production of printing plates. The disclosure of this application is hereby incorporated by reference.

In this apparatus, a ready-developed printing plate can be produced fully automatically, by electrophotographic means. For this purpose, a first laser is provided which scans the original, while a second laser synchronously exposes the printing plate. With the aid of this apparatus, it is also possible to produce printed circuits and etched parts, for example, plane coils, capacitors or toothed wheels, if a suitable insulating photoconductive layer on a metal support is employed, which is sensitized to the wavelength of the laser used.

For exposure, the laser beam is modulated optionally either according to the light areas or according to the dark areas of the original. The original is placed on a scanning platen and is scanned by a scanner element, the optical output signal of which controls, via a photomultiplier, a modulator in the beam path of the exposing laser.

The apparatus further includes means for feeding the photoconductive recording material to an exposure platen, as well as elements for producing a modulated laser beam for the imagewise exposure of the photoconductive copying material.

The examples which follow are to explain the invention in further detail; they are, however, not intended to limit the invention.

Quantitative proportions are given in parts by weight (p.b.w.). The parts by weight of the monomers contained in the copolymers are the quantities used in the polymerization.

EXAMPLE 1

A solution which is suitable for the production of printed circuits is prepared from the following components:

120 p.b.w. of a copolymer of n-hexylmethacrylate, styrene, methacrylic acid and acrylic acid (42:12:21:25 mole %),
80 p.b.w. of 2,5-bis-(4'-diethylaminophenyl)1,3,4-oxadiazole,
1 p.b.w. of Astrazone Orange G (C.I. 48 035),
0.1 p.b.w. of Rhodamine FB (C.I. 45 170), and
800 p.b.w. of tetrahydrofuran.

By means of a coating machine provided with a flow-coating system, a drying channel and a wind-up and wind-off means, the solution is applied to a 50 μm thick polyester film. After drying, the coating weight of the photoconductor layer is 20.5 g/m².

The binder used is prepared as follows:

In a three-necked flask, equipped with stirrer and reflux condenser, the following constituents are polymerized under nitrogen for 1 hour at 80° C.:
17.9 p.b.w. of n-hexylmethacrylate,
3.1 p.b.w. of styrene,
4.5 p.b.w. of methacrylic acid, and
4.5 p.b.w. of acrylic acid, dissolved in
93.3 p.b.w. of methyl ethyl ketone with an addition of
0.209 p.b.w. of azo-bis-isobutyronitrile.

In the course of 2 hours
53.6 p.b.w. of n-hexylmethacrylate,
9.4 p.b.w. of styrene,
13.4 p.b.w. of methacrylic acid, and
13.6 p.b.w. of acrylic acid, dissolved in
186.6 p.b.w. of methyl ethyl ketone with an addition of
0.630 p.b.w. of azo-di-isobutyronitrile
are then added to the contents of the flask.

Polymerization is continued for another 5 hours at 80° C.

After cooling, the reaction mixture is poured into a tenfold quantity of water, and the precipitated polymer is separated. The product is dried in a vacuum drying cabinet at 60° C. Yield: 107 g.

The product has an acid number of 159 and an intrinsic viscosity in ethanol/toluene (1 p.b.w. :1 p.b.w.) at 20° C. of 0.242.

Using a Type L.50.2 PC-Laminator, manufactured by PMF, Konstanz, Federal Republic of Germany, in which the roll temperature is adjusted to 130° C., this layer is completely transferable from the polyester film to a 35 μm thick copper foil which has been freed from any oxide layers and is laminated to a 1.5 mm thick phenoplast plate. The photoconductor layer on the copper foil can be charged to 650 V by means of a corona which has a negative potential of 5 kV. The charged layer is exposed under a transparent original or by means of a repro camera. As a result, a latent charge pattern is obtained in the non-exposed areas of the layer. This charge pattern is rendered visible by application of a triboelectrically positively charged liquid toner (dry development is just as well possible).

Exposure is advantageously carried out in the apparatus described in published European patent application 0 000 048, by means of a 16 mW argon-ion laser at a wavelength of 488 nm. Thus, the advantage of the highly light-sensitive layer according to the invention shows particularly clearly, because even at a coating weight of 20.5 g/m², the layer can be imagewise exposed at an energy of only 30 μJ/cm² This energy value is by a factor of 500 to 1000 below the energy required for commercial photoresist materials. The latent image is rendered visible as described above. The toner image is fixed by the influence of radiant heat at 170° C. for 2 minutes.

The non-image areas are decoated using an aqueous-alkaline solution of the following composition: 2.75 p.b.w. of sodium hydroxide, 4 p.b.w. of sodium metasilicate-nonahydrate, 3.75 p.b.w. of n-butylglycol, and 389.5 p.b.w. of water. The solution has a pH value of 10.3. The plate is treated with this solution for 1 to 2 minutes; it is then sprayed with water and the swollen up or dissolved components of the layer areas which are not covered by the toner are wiped off.

The pattern thus obtained serves as an etch-resist layer and it exhibits a good adhesion to the copper surface. Resolution is better than 10 lines per mm. The parts of the copper surface which have been freed from the layer can be etched away in 1 minute at 45° C. in a Type 412 G spray-etching machine, manufactured by Chemcut, Solingen, Federal Republic of Germany, using a ferric chloride solution comprising hydrochloric acid (density 1.4525). The etch resistance of the toner-covered photoconductive layer is excellent. The layer is also resistant to a weakly alkaline solution of cupric ammonium chloride at 45° C., which is commercially available for etching printed circuits comprising copper. The pH value of this solution is 8.5.

After rinsing with water and drying in a stream of air, the printed circuits are finished by removing the toner and photoconductor layer which is no longer required. This is effected by a treatment with solvents, for example, with methylene chloride or tetrahydrofuran.

EXAMPLE 2

Another photoconductor layer is prepared as follows:
120 p.b.w. of a copolymer of n-hexylmethacrylate, styrene and acrylic acid (56:12:32 mole %),
80 p.b.w. of 2-phenyl-4-(2'-chlorophenyl)-5-(4''-diethylaminophenyl)-1,3-oxazole,
1 p.b.w. of Astrazone Orange R (C.I. 48 040),
800 p.b.w. of tetrahydrofuran.

From this solution, a layer having a coating weight of 20.0 g/m² is prepared on a 75 μm thick polyethylene terephthalate film.

The copolymer used is prepared as follows:

In a three-necked flask, equipped with stirrer and reflux condenser, the following components are polymerized under nitrogen for 1 hour at 80° C.:
(a) 21.9 p.b.w. of n-hexylmethacrylate,
2.9 p.b.w. of styrene, and
5.3 p.b.w. of acrylic acid, dissolved in
100 p.b.w. of methyl ethyl ketone with an addition of
0.3 p.b.w. of azo-di-isobutyronitrile.

In the course of 2 hours
65.5 p.b.w. of n-hexylmethacrylate,
8.5 p.b.w. of styrene, and
15.8 p.b.w. of acrylic acid, dissolved in
180 p.b.w. of methyl ethyl ketone with an addition of
0.9 p.b.w. of azo-di-isobutyronitrile
are then added to the contents of the flask.

Polymerization is continued for another 5 hours at 80° C. The reaction mixture is further processed as described in Example 1.

The yield obtained is 112 g. The product has an acid number of 106 and an intrinsic viscosity at 20° C. in ethanol/toluene (1:1) of 0.148.

If the quantitative proportions are chosen in such a way that in the Example given above
(b) 66.1 p.b.w. of n-hexylmethacrylate,
13.5 p.b.w. of styrene, and
40.4 p.b.w. of acrylic acid,
are totally used, a polymer having an acid number of 226 and an intrinsic viscosity at 20° C. in ethanol/toluene (1:1) of 0.179 is obtained in a yield of 113 g.

The layers which are prepared with the binders according to a) and b) above have a good flexibility on polyester film and can be transferred completely by laminating at 130° C.

The operations described in Example 1 result in imagewise differentiated recordings on copper, in which the exposed metallic layer can be reinforced by electroplating with copper, tin, lead-tin, nickel or gold.

The layers described in Examples 1 and 2 have, in addition to the mentioned resistance to etching solutions, a good resistance to the strongly acidic baths which are normally used in electroplating.

EXAMPLE 3

A flexible photoconductor layer can be prepared from the following components:
95 p.b.w. of a copolymer of n-hexylmethacrylate, methacrylic acid and acrylic acid (50:25:25 mole %).
30 p.b.w. of polymethylvinyl ether, 50% concentration in toluene,
95 p.b.w. of the condensation product of 3-bromopyrene and formaldehyde (prepared according to German Patent No. 21 37 288),
10 p.b.w. of 3,6-dinitronaphthalene-1,8-dicarboxylic acid anhydride, and
800 p.b.w. of tetrahydrofuran.

According to the procedure of Example 1, a layer of 19.6 g/m² coating weight can be prepared on a polyethylene terephthalate film.

The binder used is prepared as follows:
In a three-necked flask, equipped with stirrer and reflux condenser, the following components are polymerized for 1 hour at 80° C. under a nitrogen atmosphere.
5.0 p.b.w. of n-hexylmethacrylate,
3.8 p.b.w. of methacrylic acid, and
3.2 p.b.w. of acrylic acid, dissolved in
4.0 p.b.w. of methyl ethyl ketone with an addition of
0.148 p.b.w. of azo-di-isobutyronitrile.

In the course of 2 hours
45.1 p.b.w. of n-hexylmethacrylate,
11.3 p.b.w. of methacrylic acid, and
9.5 p.b.w. of acrylic acid, dissolved in
208 p.b.w. of methyl ethyl ketone with an addition of
0.445 p.b.w. of azo-di-isobutyronitrile
are then added to the contents of the flask.

Polymerization is continued for another hours at 80° C.

The reaction mixture is further processed as described in Example 1. The yield obtained in 115 g. The product has an acid number of 198 and an intrinsic viscosity at 20° C. in ethanol/toluene (1:1) of 0.235.

The photoconductor layer can be completely laminated to a copper sheet at 140° C., and a corresponding image can be produced in accordance with the procedure described in Example 1. The layers so produced show the aforementioned advantages, for example, a good resistance to the baths used for etching and electroplating.

EXAMPLE 4

A flexible layer which is capable of being laminated is prepared from the following components:
120 p.b.w. of a copolymer of n-hexylmethacrylate, vinyl acetate, styrene and acrylic acid (12:38:20:30 mole %),
80 p.b.w. of 2-vinyl-4-(2'-chlorophenyl)-5-(4"-diethylaminophenyl)-1,3-oxazole,
1 p.b.w. of Astrazone Orange R, and
800 p.b.w. of tetrahydrofuran.

From this solution, a photoconductor layer which has a coating weight of 19.7 g/m² is prepared as described in Example 1 on a 50 μm thick polyethylene terephthalate film.

The binder used is prepared as follows:
In a three-necked flask, equipped with stirrer and reflux condenser, the following components are polymerized for 1 hour at 80° C. under a nitrogen atmosphere:
(a) 25.7 p.b.w. of n-hexylmethacrylate, and
25.1 p.b.w. of styrene, dissolved in
70 p.b.w. of methyl ethyl ketone with an addition of
0.3 p.b.w. of azo-di-isobutyronitrile.

In the course of 2 hours
41.1 p.b.w. of vinyl acetate, and
27.1 p.b.w. of acrylic acid, dissolved in
190 p.b.w. of methyl ethyl ketone with an addition of
0.9 p.b.w. of azo-di-isobutyronitrile
are then added to the contents of the flask.

Polymerization is continued for another 2 hours, then
1.2 p.b.w. of azo-di-isobutyronitrile in
20 p.b.w. of methyl ethyl ketone
are added. After another 3 hours and at 80° C., polymerization is completed. The reaction mixture is further processed as described in Example 1. The yield obtained is 68 g. The product has an acid number of 179 and an intrinsic viscosity at 20° C. in ethanol/toluene (1:1) of 0.139.

If the quantitative proportions are chosen in such a way that in the above Example a)
(b) 40.5 p.b.w. of n-hexylmethacrylate,
14.9 p.b.w. of styrene,
38.9 p.b.w. of vinyl acetate, and
25.7 p.b.w. of acrylic acid,
are totally employed, a polymer having an acid number of 181 and an intrinsic viscosity at 20° C. in ethanol/toluene (1:1) of 0.150 is obtained in a yield of 82 g.

The flexible layers prepared using the polymers according to (a) or (b) are capable of being completely transferred at 130° C. from the polyester film to a 40 μm thick aluminum foil which, in turn, is applied to a support film of polyester; the layers exhibit a good adhesion to this substrate.

As described in Example 1, these layers can be charged, exposed, provided with toner, fixed and decoated in the specified decoating agent. By means of a solution of 15 g of cupric chloride comprising a weak hydrochloric acid in 100 g of water at 30° C., those parts of the aluminum layer which have been freed from the photoconductor layer can be etched away within 2 minutes.

The toner-covered photoconductor layer has an excellent resistance to the etching solution used.

After rinsing with water and drying, the remaining toner and the photoconductive layer are removed with solvents. Depending on the kind of original copied, etched parts or printed circuits on flexible ribbons are thus obtained, which can also be used for reprographic purposes, as transparent originals showing image patterns of a high optical density.

What is claimed is:
1. A process for the production of a printed circuit board or an etched part, comprising the steps of:
applying to a metallic or metallized conductive layer provided on a flexible support member a flexible photosensitive layer having a thickness greater than about 15 microns and comprising a substantially organic photoconductor, at least one of at sensitizer and an activator, and a binder comprising at least one copolymer formed by copolymerizing monomers comprised of an alkyl methacrylate having 6 carbon atoms in the alkyl group and an acid component selected from acrylic acid and a mixture of acrylic acid and methacrylic acid, said copolymer having an acid number in the range from about 90 to about 250, wherein the proportion by weight of said methacrylic acid to said acrylic acid is between about 0:1 and 2:1;

charging the photosensitive layer;

exposing the photosensitive layer imagewise to an original to produce a latent charge image on non-exposed areas of the layer;

masking the latent charge image by applying toner thereto, whereby image areas of the photosensitive layer are covered by the toner;

decoating non-image areas of the photosensitive layer by applying an aqueous alkaline solution to remove portion of the photosensitive layer not covered by the toner; and chemically treating the decoated photosensitive layer to provide a conductive layer in one of the image or the non-image areas.

2. A process as claimed in claim 1, wherein said chemical treating step comprises etching the decoated non-image areas to leave a conductive layer only in the non-decoated image areas.

3. A process as claimed in claim 1, wherein said chemical treating step comprises electroplating the decoated non-image areas with metals which can serve as an etch resist mask in the subsequent etching process after decoating the image areas in order to produce a conductive pattern in the non-image areas.

* * * * *